United States Patent
Kang et al.

(10) Patent No.: US 11,551,752 B2
(45) Date of Patent: *Jan. 10, 2023

(54) NONVOLATILE MEMORY APPARATUS FOR PERFORMING A READ OPERATION AND A METHOD OF OPERATING THE SAME

(71) Applicant: SK hynix Inc., Icheon-si (KR)

(72) Inventors: Seok Joon Kang, Seoul (KR); Moo Hui Park, Icheon-si (KR); Jun Ho Cheon, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/245,870

(22) Filed: Apr. 30, 2021

(65) Prior Publication Data
US 2021/0249074 A1 Aug. 12, 2021

Related U.S. Application Data

(63) Continuation of application No. 16/677,146, filed on Nov. 7, 2019, now Pat. No. 11,024,377.

(30) Foreign Application Priority Data

Feb. 27, 2019 (KR) .......................... 10-2019-0023140

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0028* (2013.01); *G11C 2013/0045* (2013.01)

(58) Field of Classification Search
CPC .................................................... G11C 13/004
See application file for complete search history.

(56) References Cited

U.S. PATENT DOCUMENTS

| | | | |
|---|---|---|---|
| 9,286,975 B2 | 3/2016 | Chu et al. | |
| 11,024,377 B2* | 6/2021 | Kang | G11C 13/003 |
| 2010/0172171 A1 | 7/2010 | Azuma et al. | |
| 2017/0262171 A1 | 9/2017 | Cheon | |
| 2017/0372778 A1* | 12/2017 | Ha | G11C 13/004 |
| 2018/0190353 A1 | 7/2018 | Srinivasan et al. | |
| 2019/0172531 A1* | 6/2019 | Lim | G11C 13/003 |
| 2019/0206491 A1 | 7/2019 | Banerjee | |
| 2019/0244661 A1 | 8/2019 | Kim et al. | |
| 2019/0385644 A1 | 12/2019 | Kang et al. | |

FOREIGN PATENT DOCUMENTS

KR 1020180001382 A 1/2018

* cited by examiner

*Primary Examiner* — Min Huang
(74) *Attorney, Agent, or Firm* — William Park & Associates Ltd.

(57) ABSTRACT

A nonvolatile memory apparatus performs a plurality of read operations by using a plurality of read voltages. A first read operation is performed by applying a first read voltage to a memory cell. A second read operation is selectively performed based on whether a snap-back of the memory cell occurs during the first read operation. The second read operation is performed by applying a second read voltage having a higher voltage level than the first read voltage to the memory cell.

15 Claims, 6 Drawing Sheets

NONVOLATILE MEMORY APPARATUS FOR PERFORMING A READ OPERATION AND A METHOD OF OPERATING THE SAME

CROSS-REFERENCES TO RELATED APPLICATION

The present application is a continuation application of U.S. application Ser. No. 16/677,146, filed on Nov. 7, 2019, and claims priority under 35 U.S.C. § 119(a) to Korean application number 10-2019-0023140, filed on Feb. 27, 2019, in the Korean Intellectual Property Office, which is incorporated herein by reference in its entirety.

BACKGROUND

1. Technical Field

Various embodiments of the present disclosure relate to a memory apparatus and, more particularly, to a nonvolatile memory apparatus and a method of using the same to perform a read operation.

2. Related Art

Electronic devices, such as computers, have many semiconductor components, which may include memory apparatuses. Dynamic random access memory (DRAM) is widely used as a general memory apparatus having advantages of being able to store and output data at a fast and steady speed and supporting random access. However, DRAM has a volatile characteristic in that it loses stored data when powered off because it has a memory cell including a capacitor. Flash memory is used for overcoming this disadvantage of DRAM. A flash memory apparatus has a nonvolatile characteristic in that it retains stored data even when powered off because it has a memory cell including a floating gate. However, the flash memory apparatus has disadvantages, when compared with the DRAM, in that it stores and outputs data at a slow speed and does not support random access.

Recently disclosed are next-generation memory apparatuses, such as phase change RAM, magnetic RAM, resistive RAM, and ferroelectric RAM, which have the advantage of fast operational speed and nonvolatile characteristics. Particularly, PRAM has a phase change memory cell including a chalcogenide and is capable of storing data by changing a resistive value of the memory cell.

SUMMARY

In an embodiment, a nonvolatile memory apparatus may include a memory cell, a read voltage circuit, a read current circuit, and a snap-back detection circuit. The memory cell may be electrically coupled between a bit line electrode and a word line electrode. The read voltage circuit may be configured to apply a first high-bias voltage to the bit line electrode based on a first read control signal and apply a second high-bias voltage to the bit line electrode based on a second read control signal. The read current circuit may be configured to allow a first current to flow through the word line electrode during a read operation and allow a second current to flow through the word line electrode based on a repair signal. The snap-back detection circuit may be configured to generate a detection signal by detecting a snap-back of the memory cell and generate the repair signal based on the detection signal and the second read control signal.

In an embodiment, a read operation method performed by a nonvolatile memory apparatus may include performing a first read operation by applying a first read voltage across a memory cell and controlling a first current to flow through the memory cell. The read operation method may also include determining whether a snap-back of the memory cell occurs during the first read operation. The read operation method may further include selectively performing a second read operation when it is determined that the snap-back of the memory cell did not occur during the first read operation. The second read operation may be performed by applying a second read voltage across the memory cell.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Hereinafter, a semiconductor apparatus according to the present disclosure is described with reference to the accompanying drawings through various embodiments.

Figure 1:
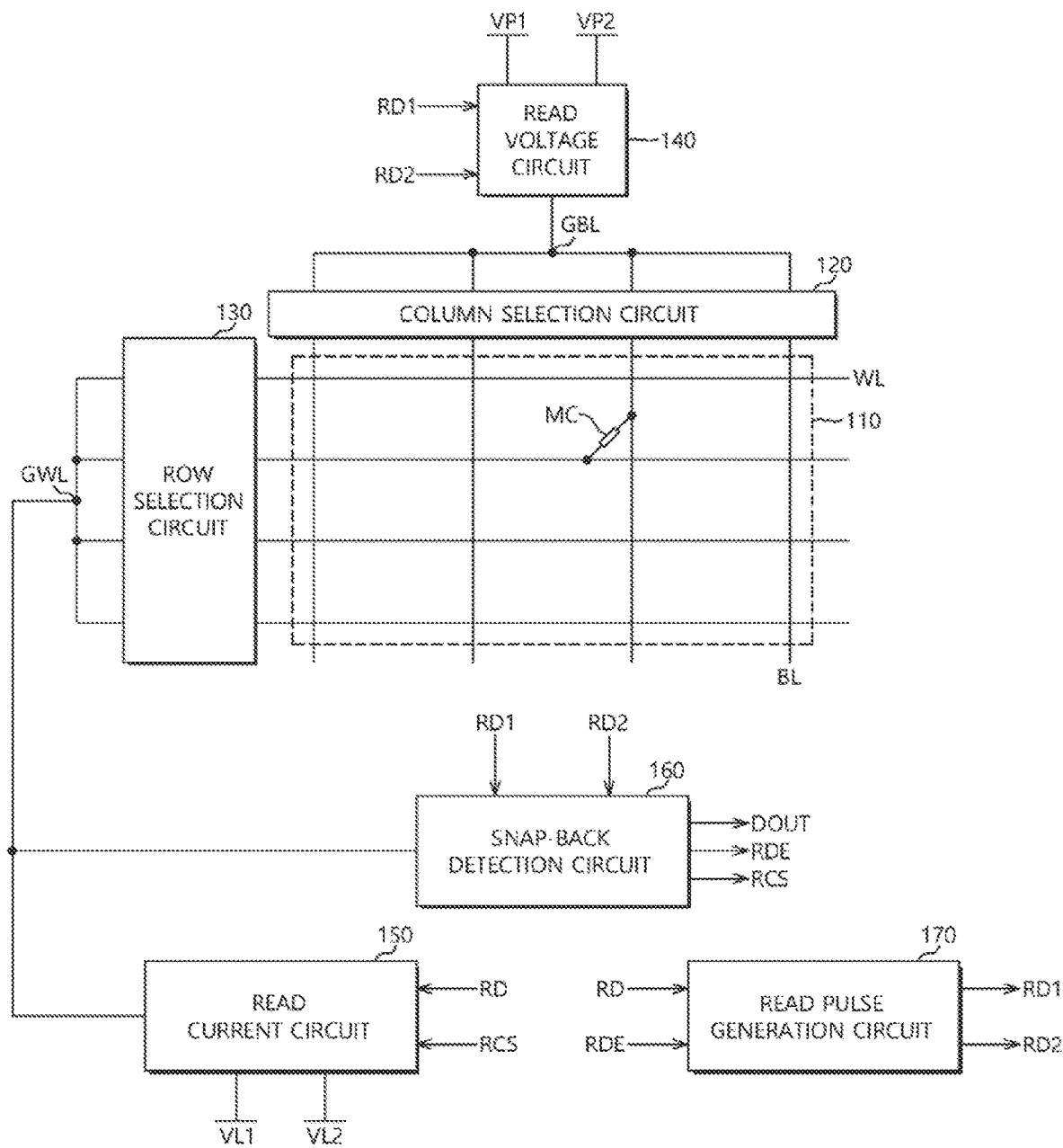
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. Referring to FIG. 1, the nonvolatile memory apparatus 100 may include a memory array 110. A plurality of bit lines BL may be disposed in a column direction within the memory array 110 and a plurality of word lines WL may be disposed in a row direction within the memory array 110. A plurality of memory cells MC may be respectively coupled to cross points between the plurality of bit lines BL and the plurality of word lines WL. The memory cell MC may be configured by a resistance change element each including a phase change material. The nonvolatile memory apparatus 100 may be a resistive memory apparatus or a phase change memory apparatus. The nonvolatile memory array 110 may be configured as a cross-point array.

The memory cell MC may store data by changing its resistance value. For example, the memory cell MC may be programmed to a high-resistance state or a low-resistance state and may store different data according to the resistance state. For example, the memory cell MC may be a set cell configured to store set data when programmed to a low-resistance state. The memory cell MC may be a reset cell configured to store reset data when programmed to a high-resistance state. In an embodiment, the memory cell MC may be programmed to more than 3 resistance states and may store multi-bit data according to the more than 3 resistance states.

The nonvolatile memory apparatus 100 may include a column selection circuit 120 and a row selection circuit 130. The column selection circuit 120 may be coupled between a bit line electrode GBL and the plurality of bit lines BL. The column selection circuit 120 may electrically couple the bit line electrode GBL to a selected bit line among the plurality of bit lines BL. The column selection circuit 120 may select a particular bit line among the plurality of bit lines BL based on a column selection signal, which may be generated on the basis of a column address signal, and may electrically couple the selected bit line to the bit line electrode GBL. The row selection circuit 130 may be electrically coupled between a word line electrode GWL and the plurality of word lines WL. The row selection circuit 130 may electrically couple the word line electrode GWL to a selected word line among the plurality of word lines WL. The row selection circuit 130 may select a particular word line among the plurality of word lines WL based on a row selection signal, which may be generated on the basis of a row address signal, and may electrically couple the selected word line to the word line electrode GWL.

The nonvolatile memory apparatus 100 may perform a read operation to output data stored in the memory cell MC. The nonvolatile memory apparatus 100 may perform a first read operation of reading data stored in the memory cell MC and may selectively perform a second read operation according to a result of the first read operation. During the first read operation, the nonvolatile memory apparatus 100 may apply a first read voltage across the memory cell MC such that a first current flows through the memory cell MC. During the second read operation, the nonvolatile memory apparatus 100 may apply a second read voltage across the memory cell MC. The nonvolatile memory apparatus 100 may selectively perform the second read operation according to whether a snap-back of the memory cell MC occurs during the first read operation. When a snap-back of the memory cell MC occurs during the first read operation, the read operation may be terminated without the second read operation. When a snap-back of the memory cell MC does not occur during the first read operation, the first read operation may be terminated and the second read operation may be performed. An operation time of the second read operation may be longer than an operation time of the first read operation. The second read operation may include a repair operation for forming the memory cell MC in a low-resistance state.

The nonvolatile memory apparatus 100 may include a read voltage circuit 140, a read current circuit 150, and a snap-back detection circuit 160. The read voltage circuit 140 may be electrically coupled to the bit line electrode GBL. The read voltage circuit 140 may change, for a read operation of the nonvolatile memory apparatus 100, a voltage level of the bit line electrode GBL. The read voltage circuit 140 may drive the bit line electrode GBL to one or more voltages based on a read signal RD. The read signal RD may be enabled when the nonvolatile memory apparatus 100 performs a read operation, and may be generated on the basis of a command signal received from an external apparatus.

The read voltage circuit 140 may receive a first read control signal RD1 and a second read control signal RD2. The read voltage circuit 140 may provide the bit line electrode GBL with voltages having different voltage levels based on the first read control signal RD1 and the second read control signal RD2. The read voltage circuit 140 may receive a first high-bias voltage VP1 and a second high-bias voltage VP2. The read voltage circuit 140 may provide the bit line electrode GBL with the first high-bias voltage VP1 based on the first read control signal RD1. The read voltage circuit 140 may provide the bit line electrode GBL with the second high-bias voltage VP2 based on the second read control signal RD2. The second high-bias voltage VP2 may have a higher voltage level than the first high-bias voltage VP1. The first read control signal RD1 may control the nonvolatile memory apparatus 100 to perform the first read operation, and the second read control signal RD2 may control the nonvolatile memory apparatus 100 to perform the second read operation. The first read control signal RD1 and the second read control signal RD2 may be generated from the read signal RD.

The read current circuit 150 may be electrically coupled to the word line electrode GWL. The read current circuit 150 may change, for a read operation of the nonvolatile memory apparatus 100, an amount of current flowing through the word line electrode GWL. Also, the read current circuit 150 may change, for a read operation of the nonvolatile memory apparatus 100, a voltage level of the word line electrode GWL. The read current circuit 150 may control different currents to flow through the word line electrode GWL by receiving the read signal RD and a repair signal RCS. The read current circuit 150 may change a current flowing through the memory cell MC by changing a current flowing through the word line electrode GWL based on the read signal RD and the repair signal RCS. The read current circuit 150 may control a first current to flow through the word line electrode GWL and the memory cell MC based on the read signal RD. The read current circuit 150 may control a second current to flow through the word line electrode GWL and the memory cell MC based on the repair signal RCS. The second current may be greater than the first current. The first current may represent a clamping current flowing through the memory cell MC for generating a snap-back of the memory cell MC during a read operation of the nonvolatile memory apparatus 100. The second current may represent a repair current, an anneal current, and/or a set-back current for keeping and/or forming the memory cell MC in a low-resistance state.

The read current circuit 150 may provide the word line electrode GWL with at least one voltage based on the read signal RD and the repair signal RCS. The read current circuit 150 may receive a first low-bias voltage VL1 and a second low-bias voltage VL2. The second low-bias voltage VL2 may have the same voltage level as the first low-bias voltage VL1 or may have a lower voltage level than the first low-bias voltage VL1. The first low-bias voltage VL1 and the second low-bias voltage VL2 may be a ground voltage or a negative voltage having lower voltage level than the ground voltage. The read current circuit 150 may provide the word line electrode GWL with the first low-bias voltage VL1 based on the read signal RD. The read current circuit 150 may provide the word line electrode GWL with the second low-bias voltage VL2 based on the repair signal RCS. A voltage level difference between the first high-bias voltage VP1 and the first low-bias voltage VL1 may correspond to the voltage level of the first read voltage, A voltage level difference between the second high-bias voltage VP2 and the first low-bias voltage VL1 may correspond to the voltage level of the second read voltage.

The snap-back detection circuit 160 may detect the snap-back of the memory cell MC. The snap-back detection circuit 160 may generate a detection signal DOUT by detecting the snap-back of the memory cell MC. The snap-back detection circuit 160 may be electrically coupled to the word line electrode GWL. The snap-back detection circuit 160 may detect the snap-back of the memory cell MC by detecting the voltage level of the word line electrode GWL. The snap-back detection circuit 160 may enable the detection signal DOUT when the snap-back of the memory cell MC occurs. The snap-back detection circuit 160 may generate the repair signal RCS based on the detection signal DOUT and the second read control signal RD2, The snap-back detection circuit 160 may enable the repair signal RCS when the snap-back of the memory cell MC occurs during the second read operation.

The snap-back detection circuit 160 may terminate the read operation when the snap-back of the memory cell MC occurs during the first read operation. The snap-back detection circuit 160 may detect the snap-back of the memory cell MC during the second read operation when the snap-back of the memory cell MC does not occur during the first read operation. The snap-back detection circuit 160 may further receive the first read control signal RD1. The snap-back detection circuit 160 may generate a read termination signal RDE based on the detection signal DOUT and the first read control signal RD1. The read termination signal RDE may be for termination of the read operation of the nonvolatile memory apparatus 100. The snap-back detection circuit 160 may enable the read termination signal RDE when the detection signal DOUT becomes enabled while the first read control signal RD1 is enabled. The snap-back detection circuit 160 may keep the read termination signal RDE disabled when the detection signal DOUT does not become enabled while the first read control signal RD1 is enabled. The snap-back detection circuit 160 may disable the read termination signal RDE when the first read control signal RD1 becomes disabled.

The snap-back detection circuit 160 may generate the repair signal RCS based on the detection signal DOUT, the read termination signal RDE, and the second read control signal RD2. The snap-back detection circuit 160 may enable the repair signal RCS when the detection signal DOUT becomes enabled while the second read control signal RD2 is enabled and the read termination signal RDE is disabled.

The nonvolatile memory apparatus 100 may further include a read pulse generation circuit 170. The read pulse generation circuit 170 may generate the first read control signal RD1 and the second read control signal RD2 based on the read signal RD and the read termination signal RDE. The read pulse generation circuit 170 may enable the first read control signal RD1 for a first amount of time when the read signal RD becomes enabled. The read pulse generation circuit 170 may disable the first read control signal RD1 and enable the second read control signal RD2 for a second amount of time when the first amount of time elapses and the read termination signal RDE is in a disabled state. The read pulse generation circuit 170 might not generate the second read control signal RD2 when the read termination signal RDE is enabled. The first amount of time and second amount of time may be arbitrarily set. The second amount of time may be greater than the first amount of time. Therefore, a pulse duration of the second read control signal RD2 may be longer than a pulse duration of the first read control signal RD1. The first amount of time may correspond to a duration of time for the snap-back of the memory cell MC to occur from when a read voltage (e.g., a first read voltage) is applied to the memory cell MC and for the snap-back detection circuit 160 to generate the detection signal DOUT by detecting the snap-back of the memory cell MC. The second amount of time may include a duration of time for the snap-back of the memory cell MC to occur from when a read voltage (e.g., a second read voltage) is applied to the memory cell MC and for the snap-back detection circuit 160 to generate the detection signal DOUT by detecting the snap-back of the memory cell MC. The second amount of time may additionally include a duration of time for the second current to be sufficiently applied to have the snap-backed memory cell MC in a low-resistance state.

Figure 2:
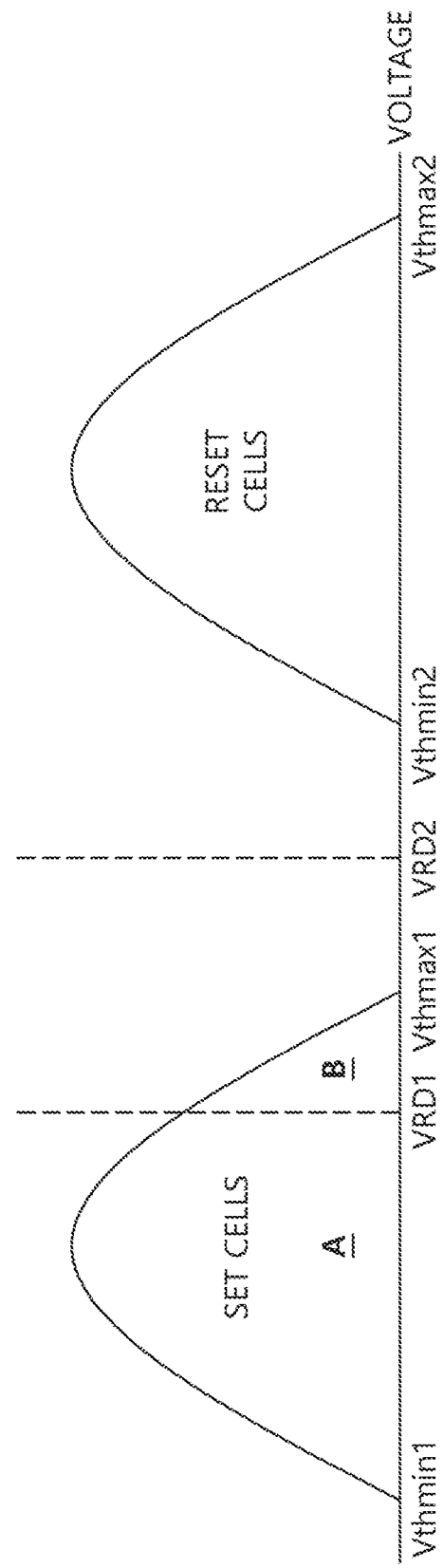
FIG. 2 is a graph illustrating threshold voltages according to resistance distributions of memory cells.

FIG. 2 is a graph illustrating threshold voltages according to resistance distributions of memory cells. In FIG. 2, the x-axis of the graph may represent a voltage. Referring to FIG. 2, memory cells in a low-resistance state may be set cells SET CELLS and memory cells in a high-resistance state may be reset cells RESET CELLS. The set cells SET CELLS may have lower threshold voltages than the reset cells RESET CELLS. The threshold voltages of the set cells SET CELLS may be distributed within a range between a set distribution minimum voltage Vthmin1 and a set distribution maximum voltage Vthmax1. The threshold voltages of the reset cells RESET CELLS may be distributed within a range between a reset distribution minimum voltage Vthmin2 and a reset distribution maximum voltage Vthmax2. The reset distribution minimum voltage Vthmin2 may have a higher voltage level than the set distribution maximum voltage Vthmax1. The first read voltage VRD1 may have a voltage level higher than the set distribution minimum voltage Vthmin1 and lower than the set distribution maximum voltage Vthmax1. For an embodiment, the first read voltage VRD1 has a voltage level closer to the set distribution maximum voltage Vthmax1 than the set distribution minimum voltage Vthmin1. The second read voltage VRD2 may have a voltage level higher than the set distribution maximum voltage Vthmax1 and lower than the reset distribution minimum voltage Vthmin2. The second read voltage VRD2 may have a voltage level about midway between the set distribution maximum voltage Vthmax1 and the reset distribution minimum voltage Vthmin2.

When the nonvolatile memory apparatus 100 illustrated in FIG. 1 performs a read operation, the first read operation may be performed first. The nonvolatile memory apparatus 100 may perform the first read operation by applying the first read voltage VRD1 and the first current to the memory cell MC. When the snap-back of the memory cell MC occurs, the memory cell MC may be detected as a set cell SET CELLS and the read operation may be terminated. When the snap-back of the memory cell MC does not occur during the first read operation, the nonvolatile memory apparatus 100 may terminate the first read operation and may perform the second read operation. The nonvolatile memory apparatus 100 may perform the second read operation by applying the second read voltage VRD2 and the second read current to the memory cell MC. When the snap-back of the memory cell MC does not occur during the second read operation, the memory cell MC may be detected as a reset cell RESET CELLS. When the snap-back of the memory cell MC occurs during the second read operation, the memory cell MC may be detected as a set cell SET CELLS. At this time, the second current may be applied to the memory cell MC for a sufficient amount of time. When the second current is applied to the memory cell MC for a sufficient amount of time, the memory cell MC may be in a low-resistance state.

In FIG. 2, "A" represents the set cells SET CELLS having threshold voltages lower than the first read voltage VRD1. And "B" represents the set cells SET CELLS having threshold voltages higher than the first read voltage VRD1. When the read operation is performed and the snap-back occurs, "B" set cells SET CELLS may be more easily disturbed than "A" set cells SET CELLS, A disturbance may mean that a resistance state of one cell is disturbed by a resistance state of another cell. For example, when a set cell SET CELLS is disturbed, the threshold voltage of the disturbed set cell may be changed to the threshold voltages of the reset cells RESET CELLS. The set cells SET CELLS of "A" may have a lower probability of being disturbed to have threshold voltages corresponding to the reset cells RESET CELLS even when the snap-back occurs. On the other hand, the set cells SET CELLS of "B" may have a higher probability of being disturbed to have threshold voltages corresponding to the reset cells RESET CELLS when the snap-back occurs. In accordance with an embodiment, the nonvolatile memory apparatus 100 might not perform the repair operation for the set cells SET CELLS that are determined to have threshold voltages corresponding to "A" through the first read operation when the snap-back occurs. Thus, power consumption may be decreased during the read operation. The nonvolatile memory apparatus 100 may perform the repair operation for the set cells SET CELLS that are determined to have the threshold voltages corresponding to "B" through the second read operation when the snap-back occurs. This may effectively mitigate the disturbance.

Figure 3:
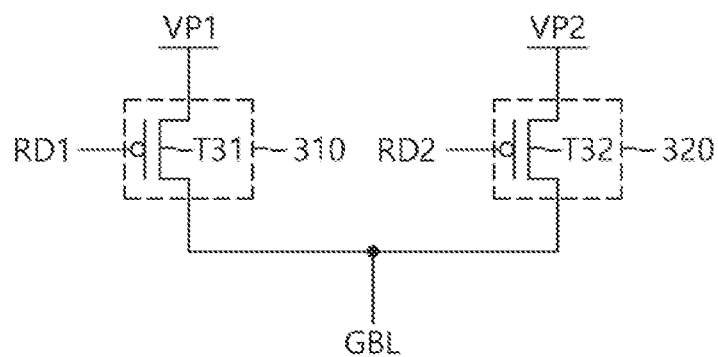
FIG. 3 is a diagram illustrating a configuration of a read voltage circuit illustrated in FIG. 1.

FIG. 3 is a diagram illustrating a configuration of the read voltage circuit 140 illustrated in FIG. 1. Referring to FIG. 3, the read voltage circuit 140 may include a first voltage supply circuit 310 and a second voltage supply circuit 320. The first voltage supply circuit 310 may provide the bit line electrode GBL with the first high-bias voltage VP1 based on the first read control signal RD1. The second voltage supply circuit 320 may provide the bit line electrode GBL with the second high-bias voltage VP2 based on the second read control signal RD2.

The first voltage supply circuit 310 may include a first transistor T31. The first transistor T31 may be a P-channel MOS transistor. The first transistor T31 may receive the first read control signal RD1 at its gate, may receive the first high-bias voltage VP1 at its source, and may be electrically coupled to the bit line electrode GBL at its drain. The second voltage supply circuit 320 may include a second transistor T32. The second transistor T32 may be a P-channel MOS transistor. The second transistor T32 may receive the second read control signal RD2 at its gate, may receive the second high-bias voltage VP2 at its source, and may be electrically coupled to the bit line electrode GBL at its drain.

Figure 4:
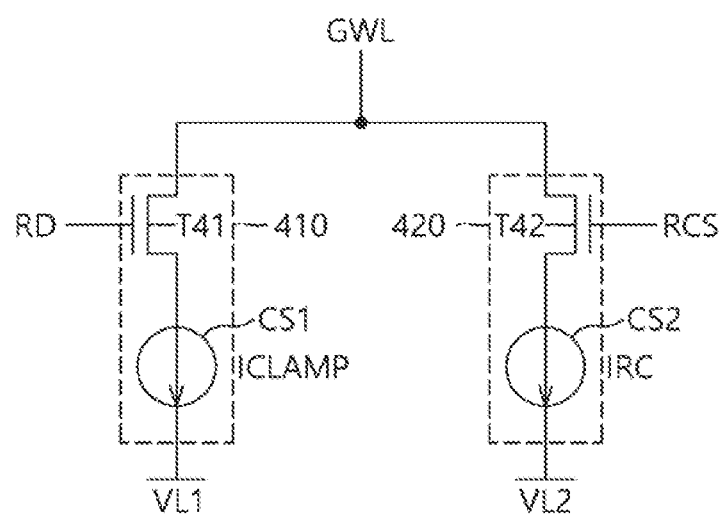
FIG. 4 is a diagram illustrating a configuration of a read current circuit illustrated in FIG. 1.

FIG. 4 is a diagram illustrating a configuration of the read current circuit 150 illustrated in FIG. 1. Referring to FIG. 4, the read current circuit 150 may include a first current supply circuit 410 and a second current supply circuit 420. The first current supply circuit 410 may control the first current ICLAMP to flow through the word line electrode GWL based on the read signal RD. The second current supply circuit 420 may control the second current IRC to flow through the word line electrode GWL based on the repair signal RCS. The first current supply circuit 410 may apply the first low-bias voltage VL1 to the word line electrode GWL. The second current supply circuit 420 may apply the second low-bias voltage VL2 to the word line electrode GWL.

The first current supply circuit 410 may include a first transistor T41 and a first current source CS1. The first transistor T41 may be a N-channel MOS transistor. The first transistor T41 may receive the read signal RD at its gate and may be electrically coupled to the word line electrode GWL at its drain. The first current source CS1 may be electrically coupled between a source of the first transistor T41 and a node to which the first low-bias voltage VL1 is provided. The first current source CS1 may control a current, an amount of which corresponds to the first current ICLAMP, to flow through the word line electrode GWL.

The second current supply circuit 420 may include a second transistor T42 and a second current source CS2. The second transistor T42 may be a N-channel MOS transistor. The second transistor T42 may receive the repair signal RCS at its gate and may be electrically coupled to the word line electrode GWL at its drain. The second current source CS2 may be electrically coupled between a source of the second transistor T42 and a node to which the second low-bias voltage VL2 is provided. The second current source CS2 may control a current, an amount of which corresponds to the second current IRC, to flow through the word line electrode GWL.

Figure 5:
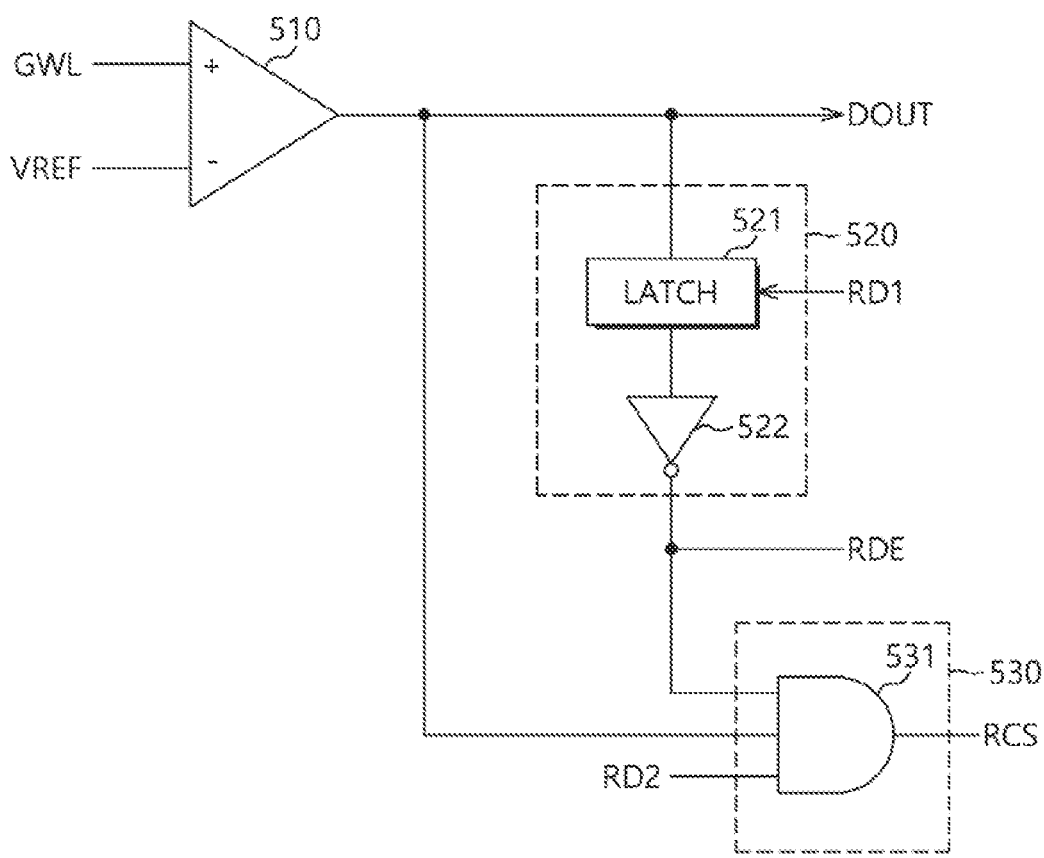
FIG. 5 is a diagram illustrating a configuration of a snap-back detection circuit illustrated in FIG. 1.

FIG. 5 is a diagram illustrating a configuration of the snap-back detection circuit 160 illustrated in FIG. 1. Referring to FIG. 5, the snap-back detection circuit 160 may include a comparator 510, a read termination signal generation circuit 520, and a repair signal generation circuit 530. The comparator 510 may be electrically coupled to the word line electrode GWL and may receive a reference voltage VREF. The comparator 510 may generate the detection signal DOUT by comparing the voltage level of the word line electrode GWL with the voltage level of the reference voltage VREF. The comparator 510 may enable the detection signal DOUT when the voltage level of the word line electrode GWL is higher than the voltage level of the reference voltage VREF. The comparator 510 may keep the detection signal DOUT disabled when the voltage level of the word line electrode GWL is lower than the voltage level of the reference voltage VREF. The reference voltage VREF may have any voltage level to detect the change of the voltage level of the word line electrode GWL when the snap-back of the memory cell MC occurs.

The read termination signal generation circuit 520 may generate the read termination signal RDE by receiving the detection signal DOUT and the first read control signal RD1. The read termination signal generation circuit 520 may include a latch 521 and an inverter 522. The latch 521 may receive the detection signal DOUT. The latch 521 may latch the level of the detection signal DOUT and may output the latched signal. The latch 521 may be activated on the basis of the first read control signal RD1. The latch 521 may latch the level of the detection signal DOUT when the first read control signal RD1 is enabled and may be initialized to output a signal of a logic low level when the first read control signal RD1 is disabled. The inverter 522 may generate the read termination signal RDE by inverting the output of the latch 521. Therefore, the read termination signal generation circuit 520 may enable the read termination signal RDE to a logic low level when the first read control signal RD1 is enabled and the detection signal DOUT is enabled. The read termination signal generation circuit 520 may disable the read termination signal RDE to a logic high level when the first read control signal RD1 is disabled.

The repair signal generation circuit 530 may generate the repair signal RCS based on the detection signal DOUT, the read termination signal RDE, and the second read control signal RD2. The repair signal generation circuit 530 may include an AND gate 531, The AND gate 531 may output the repair signal RCS by receiving the detection signal DOUT, the read termination signal RDE, and the second read control signal RD2. Therefore, the read termination signal generation circuit 520 may enable the repair signal RCS when the detection signal DOUT becomes enabled while the read termination signal RDE is disabled and the second read control signal RD2 is enabled.

Figure 6:
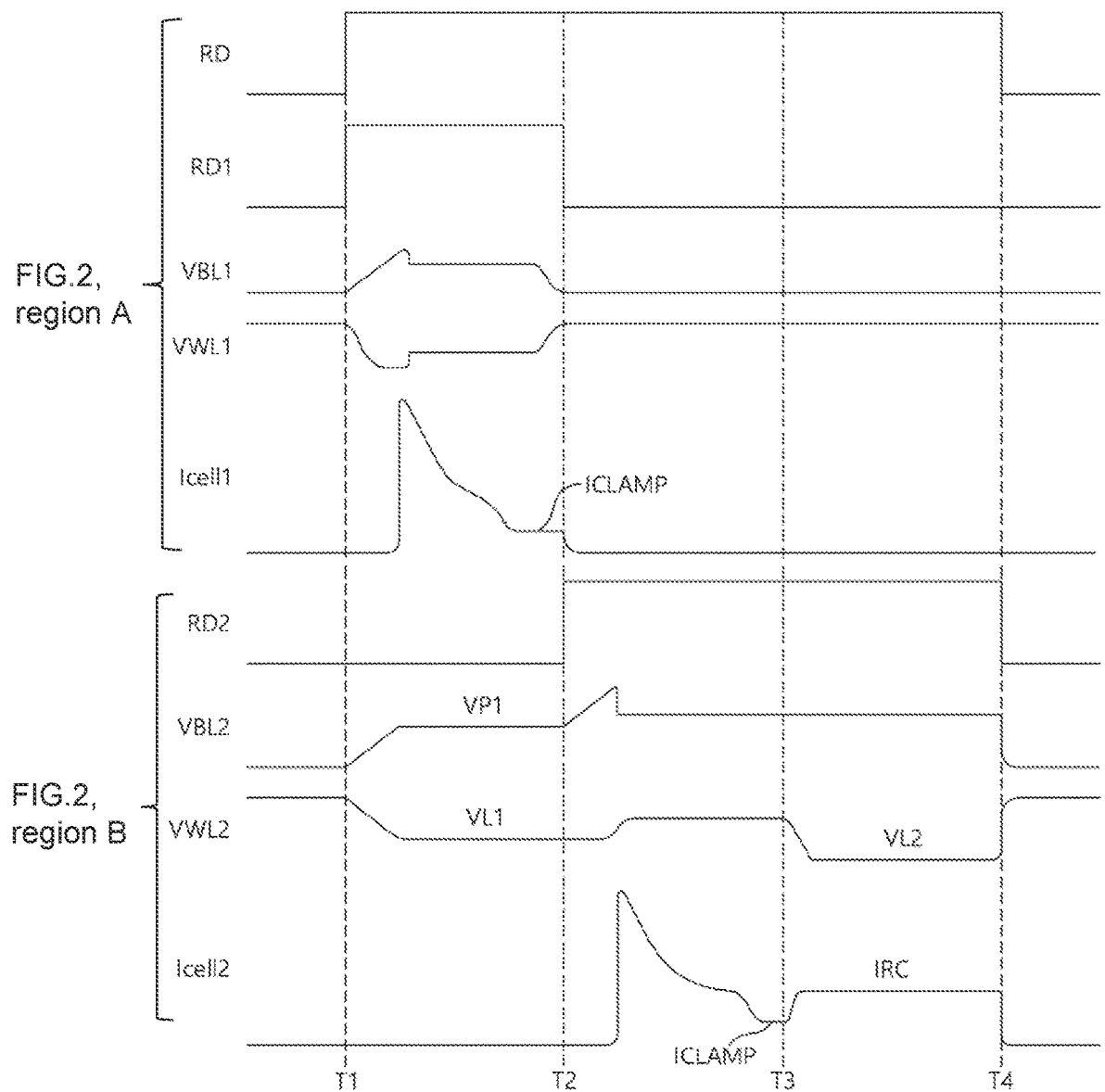
FIG. 6 is a timing diagram illustrating an operation of a nonvolatile memory apparatus in accordance with an embodiment.

FIG. 6 is a timing diagra illustrating an operation of the nonvolatile memory apparatus 100 in accordance with an embodiment of the present disclosure. Hereinafter, described with reference to FIGS. 1 to 6 is the operation of the nonvolatile memory apparatus 100 in accordance with an embodiment of the present disclosure. When the nonvolatile memory apparatus 100 performs a read operation, the read signal RD may be enabled and the read pulse generation circuit 170 may enable the first read control signal RD1 for the first amount of time. During a period from time T1 to time T2, the nonvolatile memory apparatus 100 may perform the first read operation based on the first read control signal RD1. The read voltage circuit 140 may apply the first high-bias voltage VP1 to the bit line electrode GBL based on the first read control signal RD1. The read current circuit 150 may control the first current ICLAMP to flow through the word line electrode GWL by applying the first low-bias voltage VL1 to the word line electrode GWL based on the read signal RD. The voltage level VBL1 of the bit line electrode GBL may increase to the voltage level of the first high-bias voltage VP1 and the voltage level VWL1 of the word line electrode GWL may decrease to the voltage level of the first low-bias voltage VL1, and thus the first read voltage VRD1 may be applied across the memory cell MC. When the memory cell MC has a threshold voltage within the region "A" of FIG. 2, the snap-back of the memory cell MC may occur during the first read operation. When the snap-back of the memory cell MC occurs, the memory cell current Icell1 may surge and thus a spike current occurs. Accordingly, the voltage level VBL1 of the bit line electrode GBL may slightly decrease and the voltage level VWL1 of the word line electrode GWL may slightly increase. When the snap-back of the memory cell MC occurs, the snap-back detection circuit 160 may enable the detection signal DOUT and may enable the read termination signal RDE. Accordingly, the read pulse generation circuit 170 might not generate the second read control signal RD2 based on the read termination signal RDE and the read operation of the nonvolatile memory apparatus 100 may be terminated.

When the memory cell MC has the threshold voltage within the region "B" of FIG. 2, the snap-back of the memory cell MC might not occur during the first read operation. Therefore, the read pulse generation circuit 170 may disable the first read control signal RD1 and may enable the second read control signal RD2 for the second amount of time. Accordingly, the nonvolatile memory apparatus 100 may perform the second read operation based on the second read control signal RD2 during a period from time T2 to time T4. During a period from time T2 to time T3, the nonvolatile memory apparatus 100 may perform a read operation on the memory cell MC, The read voltage circuit 140 may apply, to the bit line electrode GBL, the second high-bias voltage VP2 having the higher voltage level than the first high-bias voltage VP1 based on the second read control signal RD2. The voltage level VBL2 of the bit line electrode GBL may increase to the voltage level of the second high-bias voltage VP2, and the voltage level of the word line electrode GWL may be kept at the voltage level of the first low-bias voltage VL1. Therefore, the second read voltage VRD2 may be applied across the memory cell MC. When the snap-back of the memory cell MC occurs, the memory cell current Icell2 may surge and thus a spike current occurs. Accordingly, the voltage level VBL2 of the bit line electrode GBL may slightly decrease and the voltage level VWL2 of the word line electrode GWL may slightly increase. When the snap-back of the memory cell MC occurs, the snap-back detection circuit 160 may enable the detection signal DOUT and may enable the repair signal RCS. When the repair signal RCS is enabled, the nonvolatile memory apparatus 100 may perform a repair operation during a period from time T3 to time T4. The read current circuit 150 may control the second current IRC to flow through the memory cell MC and the word line electrode GWL by applying the second low-bias voltage VL2 to the word line electrode GWL based on the repair signal RCS. The voltage level VWL2 of the word line electrode GWL may decrease back, and the second current IRC may flow through the memory cell MC as the memory cell current Icell2, and thus the memory cell MC may be in a low-resistance state. When the repair operation is completed, the nonvolatile memory apparatus 100 may terminate the read operation.

Figure 7:
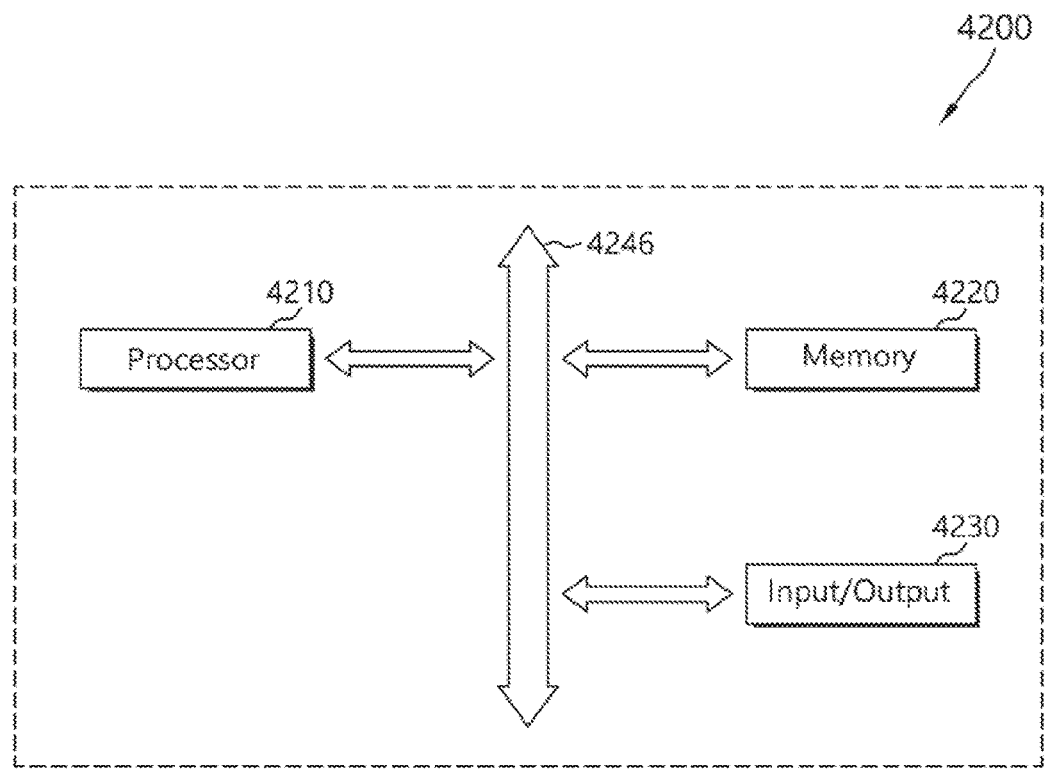
FIG. 7 illustrates a block diagram to assist in the explanation of an electronic apparatus including a semiconductor memory apparatus in accordance with an embodiment.

FIG. 7 illustrates a block diagram to assist in the explanation of an electronic apparatus including a semiconductor memory apparatuses in accordance with some embodiments. Referring to FIG. 7, an electronic apparatus 4200 may include a processor 4210, a memory 4220, and an input and output device 4230. The processor 4210, the memory 4220, and the input and output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the semiconductor nonvolatile memory apparatuses 100 associated with FIG. 1. In order for realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or any device capable of transmitting and receiving information under wireless circumstances.

Descriptions appear below for the realization and modified examples of the electronic apparatus 4200, with reference to FIGS. 10 and 11.

Figure 8:
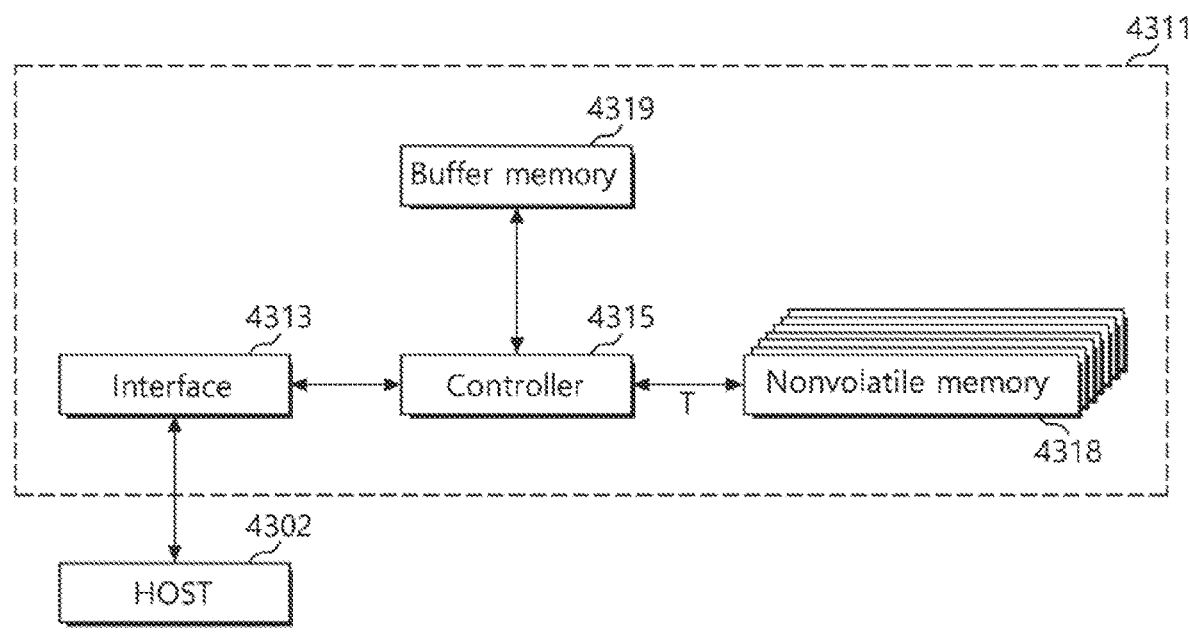
FIG. 8 illustrates a data storage device including a semiconductor memory apparatus in accordance with an embodiment.

FIG. 8 illustrates a data storage device including a semiconductor memory apparatuses in accordance with some embodiments. Referring to FIG. 8, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides an advantage of high speed. Additionally, a mechanical delay, a failure rate, heat generation, and noise generation all decrease. Further, miniaturization and light weight may be realized as compared to a hard disk drive (HDD). The solid state disk 4311 may be widely used in a notebook PC, a net book, a desktop PC, an MP3 player, or a portable storage device.

The controller 4315 may be formed adjacent to the interface 4313 and be electrically coupled to the interface 4313. The controller 4315 may be a microprocessor including a memory controller and a buffer controller. The nonvolatile memories 4318 may be formed adjacent to the controller 4315 and be electrically coupled to the controller 4315 via connection terminals T. The data storage capacity of the solid state disk 4311 may correspond to the nonvolatile memories 4318. The buffer memory 4319 may be formed adjacent to the controller 4315 and be electrically coupled to the controller 4315. Each of the nonvolatile memories 4220 may include the semiconductor memory apparatuses 100 associated with FIG. 1.

The interface 4313 may be coupled to a host 4302 and play the role of transmitting and receiving electrical signals such as data. For example, the interface 4313 may be a device which uses the same protocol as SATA, IDE, SCSI, and/or a combination thereof. The nonvolatile memories 4318 may be coupled to the interface 4313 via the controller 4315.

The nonvolatile memories 4318 may play the role of storing the data received through the interface 4313. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the semiconductor memory apparatuses 100 associated with FIG. 1.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

While certain embodiments have been described above, it will be understood by those skilled in the art that these embodiments represent only a limited number of possible examples. Accordingly, the nonvolatile memory apparatus effectively performing a read operation and a system using the same should not be limited based on the described embodiments. Rather, the nonvolatile memory apparatus effectively performing a read operation and a system using the same described herein should only be limited in light of the claims that follow when taken in conjunction with the above description and accompanying drawings.

What is claimed is:

1. A read operation method performed by a nonvolatile memory apparatus, the read operation method comprising:
   performing a first read operation by applying a first read voltage across a memory cell;
   determining whether a snap-back of the memory cell occurs during the first read operation; and
   performing a second read operation by applying a second read voltage across the memory cell when the snap-back of the memory cell does not occur during the first read operation, and terminating the read operation without performing the second read operation when the snap-back of the memory cell occurs during the first read operation,
   wherein the second read voltage has a voltage level higher than a set distribution maximum voltage and lower than a reset distribution minimum voltage.

2. The read operation method of claim 1,
   wherein the first read voltage has a voltage level higher than a set distribution minimum voltage and lower than a set distribution maximum voltage.

3. The read operation method of claim 1,
   wherein the performing the first read operation comprises controlling a first current to flow through the memory cell.

4. The read operation method of claim 3, further comprising performing a repair operation by allowing a second current to flow through the memory cell when the snap-back of the memory cell occurs during the second read operation.

5. The read operation method of claim 4,
   wherein the second current is greater than the first current and is a repair current for forming the memory cell in a low-resistance state.

6. A read operation method performed by a nonvolatile memory apparatus, the read operation method comprising:
   performing a first read operation on a memory cell by applying a first read voltage across the memory cell; and
   performing a second read operation on the memory cell by applying a second read voltage across the memory cell according to whether a snap-back of the memory cell occurs during the first read operation,
   wherein the read operation of the nonvolatile memory apparatus is terminated without performing the second read operation when the snap-back of the memory cell occurs during the first read operation,
   wherein the second read voltage has a voltage level higher than a set distribution maximum voltage and lower than a reset distribution minimum voltage.

7. The read operation method of claim 6,
   wherein the first read voltage has a voltage level higher than a set distribution minimum voltage and lower than a set distribution maximum voltage.

8. The read operation method of claim 6,
   wherein the performing the first read operation comprises controlling a first current to flow through the memory cell.

9. The read operation method of claim 8, further comprising performing a repair operation by allowing a second current to flow through the memory cell when the snap-back of the memory cell occurs during the second read operation.

10. The read operation method of claim 9,
    wherein the second current is greater than the first current and is a repair current for forming the memory cell in a low-resistance state.

11. A nonvolatile memory apparatus comprising:
    a memory cell coupled between a bit line electrode and a word line electrode,
    wherein the nonvolatile memory apparatus is configured to:
    perform a first read operation of read data stored in the memory cell by applying a first read voltage across the memory cell;
    perform a second read operation of read data stored in the memory cell by applying a second read voltage across the memory cell; and terminate a read operation without performing the second read operation when a snap-back of the memory cell occurs during the first read operation,
wherein the second read voltage has a voltage level higher than a set distribution maximum voltage and lower than a reset distribution minimum voltage.

12. The nonvolatile memory apparatus of claim 11, wherein the first read voltage has a voltage level higher than a set distribution minimum voltage and lower than a set distribution maximum voltage.

13. The nonvolatile memory apparatus of claim 11, wherein the nonvolatile memory apparatus controls a first current to flow through the memory cell when the first read operation is performed.

14. The nonvolatile memory apparatus of claim 13, wherein the nonvolatile memory apparatus is further configured to perform a repair operation by allowing a second current to flow through the memory cell when the snap-back of the memory cell occurs during the second read operation.

15. The nonvolatile memory apparatus of claim 14, wherein the second current is greater than the first current and is a repair current for forming the memory cell in a low-resistance state.

* * * * *